United States Patent
Watanabe et al.

(10) Patent No.: US 7,968,396 B2
(45) Date of Patent: Jun. 28, 2011

(54) SEMICONDUCTOR DEVICE AND MANUFACTURING METHOD OF THE SEMICONDUCTOR DEVICE

(75) Inventors: Yukimune Watanabe, Tsukuba (JP); Shinji Migita, Tsukuba (JP); Nobuyuki Mise, Tsukuba (JP)

(73) Assignees: Seiko Epson Corporation, Tokyo (JP); Renesas Technology Corporation, Tokyo (JP)

(*) Notice: Subject to any disclaimer, the term of this patent is extended or adjusted under 35 U.S.C. 154(b) by 0 days.

(21) Appl. No.: 12/591,648

(22) Filed: Nov. 25, 2009

(65) Prior Publication Data

US 2010/0072551 A1      Mar. 25, 2010

Related U.S. Application Data

(62) Division of application No. 11/446,393, filed on Jun. 5, 2006, now Pat. No. 7,645,655.

(30) Foreign Application Priority Data

Jun. 9, 2005 (JP) ................................. 2005-169631

(51) Int. Cl.
    *H01L 21/336* (2006.01)
(52) U.S. Cl. ................... 438/197; 257/288; 438/206
(58) Field of Classification Search .................. 438/113, 438/462, 460; 257/48, 288
    See application file for complete search history.

(56) References Cited

U.S. PATENT DOCUMENTS

| | | | |
|---|---|---|---|
| 6,787,827 B2 | 9/2004 | Inumiya et al. | |
| 7,145,191 B1 | 12/2006 | Teng et al. | |
| 2001/0028087 A1 | 10/2001 | Hirashita et al. | |
| 2003/0008496 A1* | 1/2003 | Deleonibus | 438/630 |
| 2004/0142546 A1 | 7/2004 | Kudo et al. | |

FOREIGN PATENT DOCUMENTS

JP    A-2002-110991    4/2002

OTHER PUBLICATIONS

Ichimori et al; Structural Study of Single {111}-Facetted CoSi$_2$/Si Interface Incorporated in a Silicon-on-Insulator Metal-Oxide-Semiconductor-Field-Effect-Transistor; J.J. Appl. Phys.; vol. 40; (2001); pp. L1019-L1021.

\* cited by examiner

*Primary Examiner* — N Drew Richards
*Assistant Examiner* — Mamadou Diallo
(74) *Attorney, Agent, or Firm* — Oliff & Berridge, PLC

(57) ABSTRACT

A semiconductor device includes a semiconductor layer formed on an insulating layer; a gate electrode disposed on said semiconductor layer via a gate insulating film; a source/drain layer composed by including an alloy layer or a metal layer with a bottom surface in contact with the insulating layer, with joint surfaces to a channel region disposed along crystal orientation faces of said semiconductor layer; and impurity-doped layers formed in a self-aligned manner along interfaces of the alloy layer or the metal layer, and said semiconductor layer.

2 Claims, 8 Drawing Sheets

SEMICONDUCTOR DEVICE AND MANUFACTURING METHOD OF THE SEMICONDUCTOR DEVICE

This is a Divisional of application Ser. No. 11/446,393 filed Jun. 5, 2006. This application claims the benefit of Japanese Patent Application No. 2005-169631, filed on Jun. 9, 2005. The entire disclosures of the prior applications are hereby incorporated by reference herein in their entirety.

BACKGROUND

1. Field of the Invention

The present invention relates to a semiconductor device and a manufacturing method of the semiconductor device, and particularly is preferable for application in a field-effect transistor reduced to a submicron order or less.

2. Description of the Related Art

In the field-effect transistors of recent years, gate lengths are shortened to a submicron order to promote densification and speedup of semiconductor integrated circuits. In order to suppress increase in resistance of source/drain layers of miniaturized field-effect transistors, silicidation of surfaces of the source/drain layers is performed.

For example, JP-A-2002-110991 (hereinafter referred to as Patent Document 1) discloses a method for forming a joint interface of a diffusion layer which is a silicon portion of an SOI layer and a metal silicide layer to be a (111) silicon plane in order to reduce junction leakage of the metal silicide layer.

However, when the gate length of a field-effect transistor is reduced to about 100 nm or less, the control power of channel potential by a gate electrode reduces, and a leakage current flowing between a source and a drain increases. Therefore, in the field-effect transistor in which the gate length is reduced to about 100 nm or less, it becomes difficult to suppress a short channel effect sufficiently, thus causing the problem that a leakage current in an off state of the field-effect transistor increases.

Further, in the method of siliciding the surfaces of the source/drain layer, when the silicide layer reaches the joint surfaces of the source/drain layer and the channel region, junction leakage is caused, and therefore, it is necessary to make the silicide layer thin, thus causing the problem of making it difficult to contribute to reduction in resistance of the source/drain layer sufficiently.

In the method disclosed in Patent Document 1, there is the problem that when the silicide layer reaches the area in the vicinity of the joint surfaces of the source/drain layer and the channel region, and when the silicide reaction proceeds beyond the joint surfaces of the source/drain layer and the channel region, junction leakage is caused.

SUMMARY

It is an object of the present invention to provide a semiconductor device in which while junction leakage is suppressed, resistance of a source/drain layer is reduced, and a short channel effect can be suppressed, and a manufacturing method of the semiconductor device.

In order to attain the above-described object, a semiconductor device according to one aspect of the present invention is characterized by including a semiconductor layer formed on an insulating layer, a gate electrode disposed on the aforesaid semiconductor layer via a gate insulating film, a source/drain layer composed by including an alloy layer or a metal layer with a bottom surface in contact with the insulating layer, with joint surfaces to a channel region disposed along crystal orientation faces of the aforesaid semiconductor layer, and impurity-doped layers formed in a self-aligned manner along interfaces of the alloy layer or the metal layer, and the aforesaid semiconductor layer.

Thereby, it becomes possible to construct the source/drain layer of the alloy layer or the metal layer disposed in all over the depth direction of the semiconductor layer while widening the channel region in the depth direction, and the thickness of the impurity-doped layers disposed along the interfaces of the source/drain layer and the semiconductor layer can be made uniform while flatness of the joint surfaces are enhanced. Therefore, even when the alloy layer or the metal layer is formed so that the bottom surface is in contact with the insulating layer, it becomes possible to make the alloy layer or the metal layer not to be in contact with the semiconductor layer being the channel region, thus making it possible to reduce the resistance of the source/drain layer while suppressing junction leakage, and to enhance the energy barrier in the deep region of the channel on which the control by the gate electrode is difficult to exert, and the short channel effect can be suppressed.

A semiconductor device according to one aspect of the present invention is characterized by including a gate electrode disposed on a semiconductor substrate via a gate insulating film, a source/drain layer composed by including an alloy layer or a metal layer, with joint surfaces to a channel region disposed along crystal orientation faces of the semiconductor substrate, and impurity-doped layers formed in a self-aligned manner along interfaces of the alloy layer or the metal layer and the semiconductor substrate.

Thereby, it becomes possible to thicken the alloy layer or the metal layer composing the source/drain layer while widening the channel region in the depth direction, and the thickness of the impurity-doped layers disposed along the interfaces of the source/drain layer and the semiconductor substrate can be made uniform while flatness of the joint surfaces to the channel region is enhanced. Therefore, even when the alloy layer or the metal layer is thickened, it becomes possible to keep the alloy layer or the metal layer from being in contact with the semiconductor substrate, thus making it possible to reduce the resistance of the source/drain layer while suppressing junction leakage and to enhance the energy barrier of the deep region of the channel on which the control by the gate electrode is difficult to exert, and the short channel effect can be suppressed.

A semiconductor device according to one aspect of the present invention is characterized by including a semiconductor layer formed on an insulating layer, a gate electrode disposed on the aforesaid semiconductor layer via a gate insulating film, and a source/drain layer composed of a metal layer with a bottom surface in contact with the insulating layer, with joint surfaces to a channel region disposed along crystal orientation faces of the aforesaid semiconductor layer.

Thereby, it becomes possible to compose the source/drain layer of the metal film disposed in all over the depth direction of the semiconductor layer while widening the channel region in the depth direction. Therefore, it becomes possible to reduce the resistance of the source/drain layer and to enhance the energy barrier in the deep region of the channel on which the control by the gate electrode is difficult to exert, and a short channel effect can be suppressed.

A semiconductor device according to one aspect of the present invention is characterized by including a gate electrode disposed on a semiconductor substrate via a gate insulating film, and a source/drain layer composed of a metal layer with joint surfaces to a channel region disposed along crystal orientation faces of the semiconductor substrate.

Thereby, it becomes possible to thicken the metal layer composing the source/drain layer while widening the channel region in the depth direction. Therefore, it becomes possible to reduce the resistance of the source/drain layer and to enhance the energy barrier in the deep region of the channel on which the control by the gate electrode is difficult to exert, and a short channel effect can be suppressed.

A semiconductor device according to one aspect of the present invention is characterized in that the crystal orientation faces are (111) planes.

Thereby, it becomes possible to widen the channel region in the depth direction while securing flatness of the joint surfaces of the source/drain layer and the channel region, and the crystal orientation faces being the boundaries of the channel region can be exposed without damaging to the channel region.

A manufacturing method of a semiconductor device according to one aspect of the present invention is characterized by including the steps of forming a gate electrode above a semiconductor layer, forming a source/drain layer composed by including an alloy layer or a metal layer joined to a channel region of the semiconductor layer, introducing an impurity into the alloy layer or the metal layer, by expelling the impurity introduced into the alloy layer or the metal layer to the semiconductor layer side, forming impurity-doped layers disposed at interfaces of the alloy layer or the metal layer and the semiconductor layer.

Thereby, the impurity-doped layers can be formed by diffusing the impurity expelled from the alloy layer or the metal layer to the semiconductor layer side, and it becomes possible to dispose the impurity-doped layers in a self-aligned manner along the interfaces of the alloy layer or the metal layer and the semiconductor layer. Therefore, even when the alloy layer or the metal layer is formed so that the bottom surfaces are in contact with the insulating layer, it becomes possible to keep the alloy layer or the metal layer from being in contact with the semiconductor layer being the channel region, and it becomes possible to reduce the resistance of the source/drain layer while suppressing the junction leakage. Further, by diffusing the impurity to the semiconductor layer side via the alloy layer or the metal layer, the temperature necessary for introducing the impurity to the semiconductor side can be lowered, thus making it possible to reduce damage to the metal gate and the high dielectric constant insulating film, and making it unnecessary to perform ion-implantation directly into the semiconductor layer for introducing the impurity into the semiconductor layer, and the crystal defect occurring to the channel region can be reduced.

A manufacturing method of a semiconductor device according to one aspect of the present invention is characterized by including the steps of forming a dummy gate electrode above a semiconductor layer, forming a source/drain layer composed by including an alloy layer or a metal layer joined to a channel region of the semiconductor layer, introducing an impurity into the alloy layer or the metal layer, by expelling the impurity introduced into the alloy layer or the metal layer to the semiconductor layer side, forming impurity-doped layers disposed at interfaces of the alloy layer or the metal layer and the semiconductor layer, forming an insulating layer in which the dummy gate electrode is buried on the semiconductor layer, forming a trench corresponding to the dummy gate electrode in the insulating layer by removing the dummy gate electrode buried in the insulating layer, and burying the gate electrode into the trench.

Thereby, it becomes possible to form the gate electrode after forming the impurity-doped layer while keeping self alignment property of the disposing position of the gate electrode with respect to the impurity-doped layers. Therefore, the thermal load necessary to form the impurity-doped layers and the like is prevented from being exerted on the gate electrode, and it becomes possible to facilitate metallization of the gate electrode.

A manufacturing method of a semiconductor device according to one aspect of the present invention is characterized by including the steps of forming a gate electrode above a semiconductor layer disposed on an insulating layer, forming side walls at side walls of the gate electrode, forming a metal film on an entire surface on the semiconductor layer on which the side walls are formed, by reacting the metal film with the semiconductor layer by first thermal treatment, forming an alloy layer disposed at sides of the side walls, removing an unreacted metal film at a time of forming the alloy layer, introducing an impurity into the alloy layer, and by causing a bottom surface of the alloy layer to be in contact with the insulating layer by second thermal treatment, forming a source/drain layer composed of the alloy layer with joint surfaces disposed along crystal orientation faces of the semiconductor layer, and by diffusing the impurity introduced into the alloy layer to the semiconductor layer side, forming impurity-doped layers disposed at interfaces of the source/drain layer and the semiconductor layer.

Thereby, it becomes possible to compose the source/drain layer of the alloy layer disposed in all over the depth direction of the semiconductor layer while widening the channel region in the depth direction, the impurity-doped layers can be formed by diffusing the impurity expelled from the alloy layer to the semiconductor layer side, thus making it possible to dispose the impurity-doped layers in the self-aligned manner along the interfaces of the alloy layer and the semiconductor layer. Therefore, even when the alloy layer is formed so that the bottom surface is in contact with the insulation layer, it becomes possible to keep the alloy layer from being in contact with the semiconductor layer being the channel region. Thus, it becomes possible to reduce the resistance of the source/drain layer while suppressing the junction leakage, and the energy barrier in the deep region of the channel on which the control by the gate electrode is difficult to exert can be enhanced, thus making it possible to suppress a short channel effect.

A manufacturing method of a semiconductor device according to one aspect of the present invention is characterized by including the steps of forming a gate electrode above a semiconductor substrate, forming side walls at side walls of the gate electrode, forming a metal film on an entire surface on the semiconductor substrate on which the side walls are formed, by reacting the metal film and the semiconductor substrate by first thermal treatment, forming alloy layers disposed at sides of the side walls, removing an unreacted metal film at a time of forming the alloy layers, introducing an impurity into the alloy layers, and forming a source/drain layer composed of alloy layers with joint surfaces to a channel region disposed along crystal orientation faces of the semiconductor layer by second thermal treatment, diffusing the impurity introduced into the alloy layers to the semiconductor substrate side, and forming impurity-doped layers disposed at interfaces of the source/drain layer and the semiconductor substrate.

Thereby, it becomes possible to thicken the alloy layer composing the source/drain layer while widening the channel region in the depth direction, and the impurity-doped layer can be formed by diffusing the impurity expelled from the alloy layer to the semiconductor substrate side, thus making it possible to dispose the impurity-doped layers in the self-aligned manner along the interfaces of the alloy layer and the semiconductor substrate. Therefore, even when the alloy layer is thickened, it becomes possible to keep the alloy layer from being in contact with the semiconductor substrate being the channel region, and it becomes possible to reduce the resistance of the source/drain layer while suppressing the junction leakage, thus making it possible to enhance the energy barrier in the deep region of the channel on which the control of the gate electrode is difficult to exert, and to suppress a short channel effect.

A manufacturing method of a semiconductor device according to one aspect of the present invention is characterized by including the steps of forming a gate electrode above a semiconductor layer disposed on an insulating layer, forming side walls at side walls of the gate electrode, by etching the semiconductor layer with the gate electrode and the side walls as a mask, exposing inclined surfaces of the semiconductor layer along crystal orientation faces, forming a metal film or an alloy film on an entire surface on the insulating layer so that the exposed inclined surfaces are covered with the metal film or the alloy film, by removing the metal film or the alloy film on the gate electrode, forming a source/drain layer composed of the metal film or the alloy film joined to the semiconductor layer via the crystal orientation faces.

Thereby, it becomes possible to compose the source/drain layer of the metal film or the alloy film disposed in all over the entire depth direction of the semiconductor layer while widening the channel region in the depth direction, and it is not necessary to react the metal with the semiconductor layer to compose the source/drain layer of the metal film or the alloy film. Therefore, even when the source/drain layer is composed of the metal film or the alloy film, it becomes possible to increase the choices of the kind of the metal film or the alloy film, and it becomes possible to stabilize the composition of the metal film or the alloy film, thus making it possible to reduce the resistance of the source/drain layer and to suppress a short channel effect.

A manufacturing method of a semiconductor device according to one aspect of the present invention is characterized by further including the steps of introducing an impurity into the metal film or the alloy layer, and by diffusing the impurity introduced into the metal film or the alloy layer to the semiconductor layer side, forming impurity-doped layers disposed at interfaces of the source/drain layer and the semiconductor layer.

Thereby, the impurity-doped layer can be formed by diffusing the impurity expelled from the metal film or the alloy film to the semiconductor layer side, and it becomes possible to dispose the impurity-doped layer in the self-aligned manner along the interfaces of the metal film or the alloy film and the semiconductor layer. Therefore, even when the metal film or the alloy layer is formed so that the bottom surface is in contact with the insulating layer, it becomes possible to keep the metal film or the alloy layer from being in contact with the semiconductor layer being the channel region, and it becomes possible to reduce the resistance of the source/drain layer while suppressing the junction leakage.

A manufacturing method of a semiconductor device according to one aspect of the present invention is characterized by including the steps of forming a gate electrode above a semiconductor substrate, forming side walls at side walls of the gate electrode, by etching the semiconductor substrate with the gate electrode and the side walls as a mask, exposing inclined surfaces of the semiconductor substrate along crystal orientation faces of the semiconductor substrate, forming a metal film or an alloy film on an entire surface on the semiconductor substrate so that the exposed inclined surfaces are covered with the metal film or the alloy film, by removing the metal film or the alloy film on the gate electrode, forming a source/drain layer composed of the metal film or the alloy film joined to the semiconductor substrate via the crystal orientation faces.

Thereby, it becomes possible to thicken the metal film or the alloy layer composing the source/drain layer while widening the channel region in the depth direction, and since the source/drain layer is composed of the metal film or the alloy film, it is not necessary to react the metal with the semiconductor substrate. Therefore, it becomes possible to reduce the resistance of the source/drain layer, and a short channel effect can be suppressed.

DETAILED DESCRIPTION OF THE PREFERRED EMBODIMENTS

Hereinafter, a semiconductor device and its manufacturing method according to embodiments of the present invention will be described with reference to the drawings.

Figure 1:
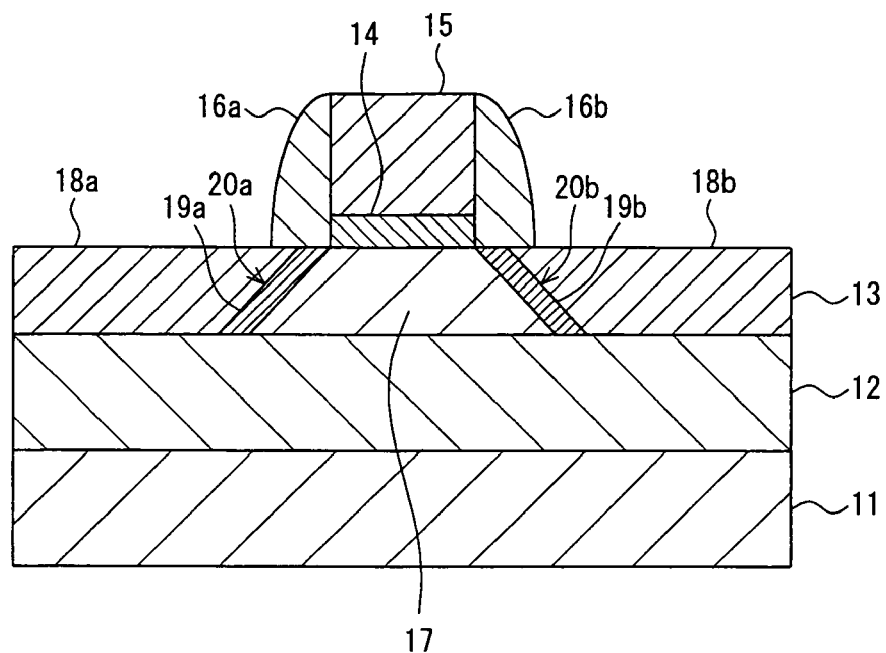
FIG. 1 is a sectional view showing a schematic construction of a semiconductor device according to a first embodiment of the present invention.

FIG. 1 is a sectional view showing a schematic construction of a semiconductor device according to a first embodiment of the present invention.

In FIG. 1, an insulating layer 12 is formed on a supporting substrate 11, and a monocrystal semiconductor layer 13 is formed on the insulating layer 12. As the supporting substrate 11, a semiconductor substrate of Si, Ge, SiGe, GaAs, InP, GaP, GaN, SiC or the like may be used, or an insulating substrate of glass, sapphire, ceramics or the like may be used. As the material of the monocrystal semiconductor layer 13, for example, Si, Ge, SiGe, SiC, SiSn, PbS, GaAs, InP, GaP, GaN, ZnSe or the like can be used, and as the insulating layer 12, an insulating layer or a buried insulating film of, for example, $SIO_2$, $SiON$, $Si_3N_4$ or the like can be used. As the semiconductor substrate with the monocrystal semiconductor layer 13 formed on the insulating layer 12, for example, an SOI substrate can be used, and as the SOI substrate, an SIMOX (Separation by Implanted Oxygen) substrate, a bonded substrate, a laser anneal substrate or the like can be used. Instead of the monocrystal semiconductor layer 13, a polycrystalline semiconductor layer or an amorphous semiconductor layer may be used.

A gate electrode 15 is disposed on the monocrystal semiconductor layer 13 via a gate insulating film 14. As a material of the gate insulating film 14, a dielectric of, for example, $HfO_2$, HfON, HfAlO, HfAlON, HfSiO, HfSiON, $ZrO_2$, ZrON, ZrAlO, ZrAlON, ZrSiO, ZrSiON, $Ta_2O_5$, $Y_2O_3$, (Sr, Ba)$TiO_3$, $LaAlO_3$, $SrBi_2Ta_2O_9$, $Bi_4Ti_3O_{12}$, Pb (Zi, Ti) $O_3$ or the like may be used other than $SiO_2$. As the material of the gate electrode 15, for example, a metal material of TaN, TiN, W, Pt, Cu or the like may be used other than polycrystalline silicon. The gate length of the gate electrode 15 is preferably set at 100 nm or less.

A side wall 16a is formed at one side wall of the gate electrode 15, and a side wall 16b is formed at the other side wall of the gate electrode 15. At one side of the gate electrode 15, a source layer 18a formed of an alloy layer with its bottom surface in contact with the insulating layer 12 is disposed. Here, in the alloy layer composing the source layer 18a, a joint surface to a channel region 17 is formed along a crystal orientation face 20a of the monocrystal semiconductor layer 13. At the other side of the gate electrode 15, a drain layer 18b formed of an alloy layer with its bottom surface in contact with the insulating layer 12 is disposed. Here, in the alloy layer composing the drain layer 18b, a joint surface to the channel region 17 is formed along a crystal orientation face 20b of the monocrystal semiconductor layer 13.

The alloy layer can be formed by reacting metal with the monocrystal substrate layer 13. When the monocrystal semiconductor layer 13 is formed of monocrystal Si, silicide can be used, when the monocrystal semiconductor layer 13 is formed of monocrystal SiGe, germanosilicide can be used, and when the monocrystal semiconductor layer 13 is formed of monocrystal Ge, germanoide can be used. Metal included in the alloy layer can be alloyed by being reacted with the monocrystal semiconductor layer 13, and for example, Ti, Co, W, Mo, Ni, Pt or the like can be used. Here, it is preferable to select the alloy layer having a lattice constant close to that of the monocrystal semiconductor layer 13, and it is preferable that the difference between the lattice constants of the alloy layer and the monocrystal semiconductor layer 13 is within 1%. The crystal orientation faces 20a and 20b can be, for example, (111) planes of the monocrystal semiconductor layer 13.

An impurity-doped layer 19a formed in a self-aligned manner to be along the crystal orientation face 20a is provided at an interface of the alloy layer composing the source layer 18a and the monocrystal semiconductor layer 13. Further, an impurity-doped layer 19b formed in a self-aligned manner to be along the crystal orientation face 20b is provided at an interface of the alloy layer composing the drain layer 18b and the monocrystal semiconductor layer 13. The impurity-doped layers 19a and 19b can be doped in a high concentration so that an energy barrier does not occur between the impurity-doped layers 19a and 19b and the alloy layers composing the source layer 18a and the drain layer 18b.

Thereby, it becomes possible to compose the source layer 18a and the drain layer 18b of the alloy layers disposed in all over the depth direction of the monocrystal semiconductor layer 13 while widening the channel region 17 in the depth direction, and the thickness of the impurity-doped layers 19a and 19b disposed along the interface of the alloy layer and the monocrystal semiconductor layer 13 can be made uniform while flatness of the joint surfaces is enhanced. Therefore, even when the alloy layers are formed for the source layer 18a and the drain layer 18b so that the bottom surfaces are in contact with the insulating layer 12, it becomes possible for the alloy layer not to be in contact with the monocrystal semiconductor layer 13 being the channel region, and it becomes possible to reduce resistance of the source layer 18a and the drain layer 18b while suppressing junction leakage. In addition, energy barrier in the deep region of the channel on which control by the gate electrode 15 is not exerted can be enhanced, and a short channel effect can be suppressed.

Figure 2:
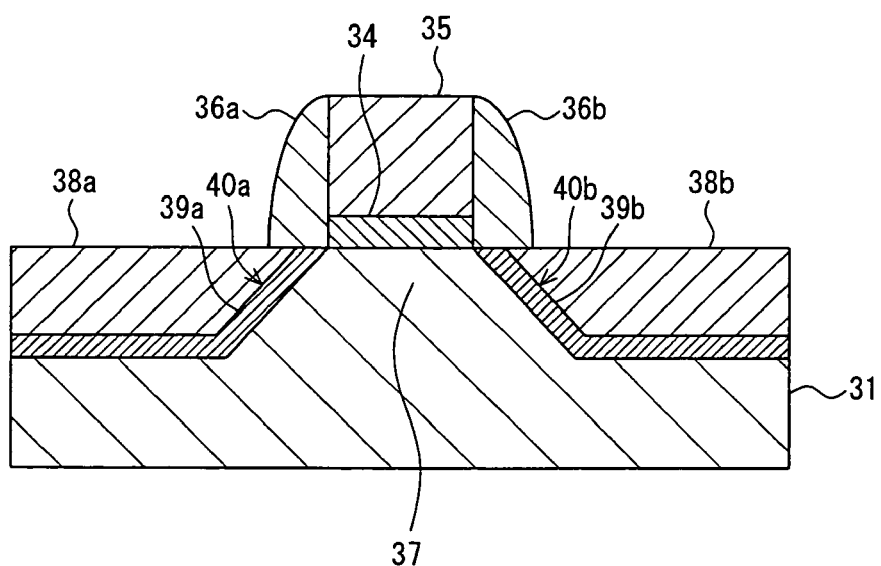
FIG. 2 is a view showing a schematic construction of a semiconductor device according to a second embodiment of the present invention.

FIG. 2 is a sectional view showing a schematic construction of a semiconductor device according to a second embodiment of the present invention.

In FIG. 2, a gate electrode 35 is disposed on a semiconductor substrate 31 via a gate insulating film 34. A side wall 36a is formed at one side wall of the gate electrode 35, and a side wall 36b is formed at the other side wall of the gate electrode 35. A source layer 38a composed of an alloy layer buried in the semiconductor substrate 31 is disposed at one side of the gate electrode 35. Here, in the alloy layer composing the source layer 38a, a joint surface to a channel region 37 is formed along a crystal orientation face 40a of the semiconductor substrate 31. A drain layer 38b composed of an alloy layer buried in the semiconductor substrate 31 is disposed at the other side of the gate electrode 35. Here, in the alloy layer composing the drain layer 38b, a joint surface to the channel region 37 is formed along a crystal orientation face 20b of the semiconductor substrate 31. When a (100) substrate is used as the semiconductor substrate 31, the crystal orientation faces 40a and 40b can be, for example, (111) planes of the semiconductor substrate 31. When the semiconductor substrate 31 is formed of monocrystal Si, silicide can be used for the alloy layers 38a and 38b.

An impurity-doped layer 39a formed in a self-aligned manner to be along an interface with the semiconductor substrate 31 is provided at the interface of the alloy layer composing the source layer 38a and the semiconductor substrate 31. An impurity-doped layer 39b formed in a self-aligned manner to be along an interface with the semiconductor substrate 31 is provided at the interface of the alloy layer composing the drain layer 38b and the semiconductor substrate 31. The impurity-doped layers 39a and 39b can be doped in a high concentration so that an energy barrier does not occur between the impurity-doped layers 39a and 39b and the alloy layers composing the source layer 38a and the drain layer 38b.

Thereby, it becomes possible to thicken the alloy layers composing the source layer 38a and the drain layer 38b while widening the channel region 37 in the depth direction, and the thickness of the impurity-doped layers 39a and 39b disposed along the interface of the alloy layers and the semiconductor substrate 31 can be made uniform while flatness of the joint surfaces to the channel region 37 is enhanced. Therefore, even when the alloy layer formed in the semiconductor substrate 31 is thickened, it becomes possible for the alloy layer not to be in contact with the semiconductor substrate 31 being the channel region, and it becomes possible to reduce resistance of the source layer 38a and the drain layer 38b while suppressing junction leakage. In addition, the energy barrier in the deep region of the channel on which the control of the gate electrode 35 is not exerted can be enhanced, and a short channel effect can be suppressed.

Figure 3A:
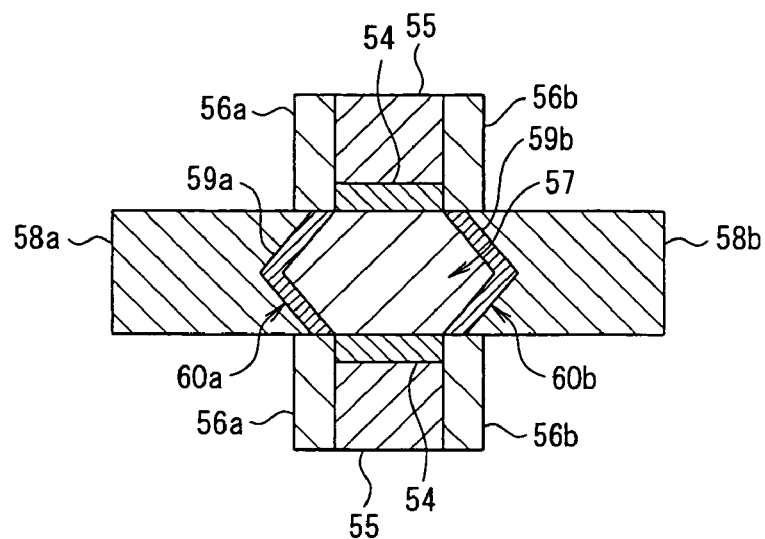
FIGS. 3A and 3B are views showing schematic constructions of a semiconductor device according to a third embodiment of the present invention.
Figure 3B:
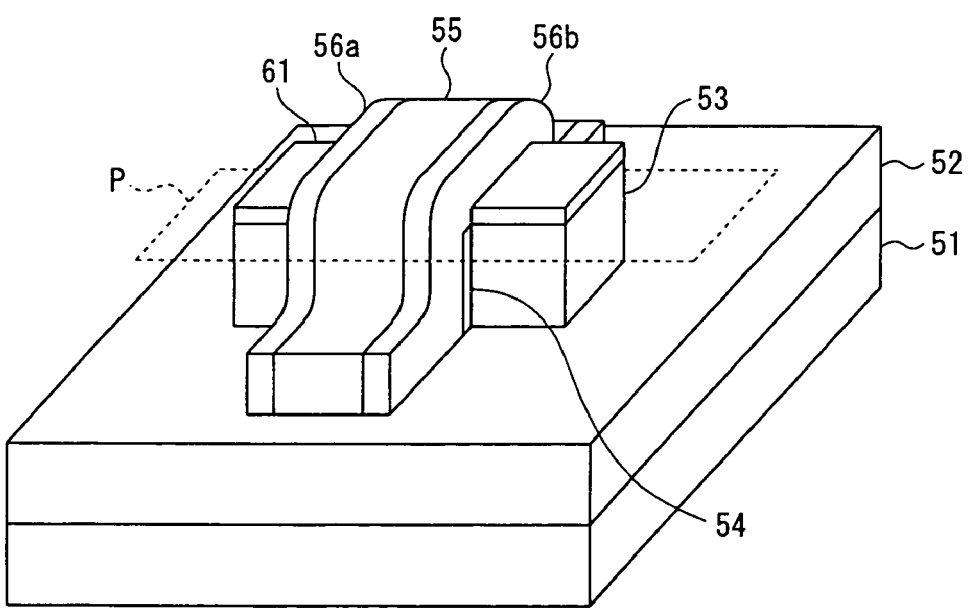

FIG. 3B is a perspective view showing a schematic construction of a semiconductor device according to a third embodiment of the present invention, and FIG. 3A is a sectional view which is cut along a P plane in FIG. 3B.

In FIGS. 3A and 3B, an insulating layer 52 is formed on a supporting substrate 51, and a monocrystal semiconductor layer 53 having a fin shape is formed on the insulating layer 52. An insulating layer 61 is formed on the monocrystal semiconductor layer 53, and at side walls at both sides of the monocrystal semiconductor layer 53, a gate electrode 55 disposed to stride over the monocrystal semiconductor layer 53 is formed via a gate insulating film 54. A side wall 56a is formed at one side wall of the gate electrode 55, and a side wall 56b is formed at the other side wall of the gate electrode 55. At one side of the gate electrode 55, a source layer 58a in which the entire monocrystal semiconductor layer 53 is filled with an alloy layer is disposed. Here, in the alloy layer composing the source layer 58a, a joint surface to a channel region 57 is formed to widen in the depth direction along a crystal orientation face 60a of the monocrystal semiconductor layer 53. At the other side of the gate electrode 55, a drain layer 58b in which the entire single crystal semiconductor layer 53 is filled with an alloy layer is disposed. Here, in the alloy layer composing the drain layer 58b, a joint surface to the channel region 57 is formed to widen in the depth direction along the crystal orientation surface 60b of the monocrystal semiconductor layer 53. As the alloy layers 58a and 58b, silicide can be used when the semiconductor substrate 51 is formed of monocrystal Si. The crystal orientation faces 60a and 60b can be, for example, (111) planes of the monocrystal semiconductor layer 53.

An impurity-doped layer 59a formed in a self-aligned manner to be along the crystal orientation face 60a is provided at an interface of the alloy layer composing the source layer 58a and the monocrystal semiconductor layer 53. An impurity-doped layer 59b formed in a self-aligned manner to be along the crystal orientation face 60b is provided at an interface of the alloy layer composing the drain layer 58b and the monocrystal semiconductor layer 53. The impurity-doped layers 59a and 59b can be doped in a high concentration so that an energy barrier does not occur between the impurity-doped layers 59a and 59b and the alloy layers composing the source layer 58a and the drain layer 58b.

Thereby, it becomes possible to control the potential of the channel region 57 from a plurality of directions while widening the channel region 57 in the depth direction, and it becomes possible to compose the source layer 58a and the drain layer 58b of the alloy layers disposed in all over the depth direction of the monocrystal semiconductor layer 53. Therefore, it becomes possible to reduce resistance of the source layer 58a and the drain layer 58b, and the current drive ability can be enhanced while suppressing a short channel effect.

Figure 4:
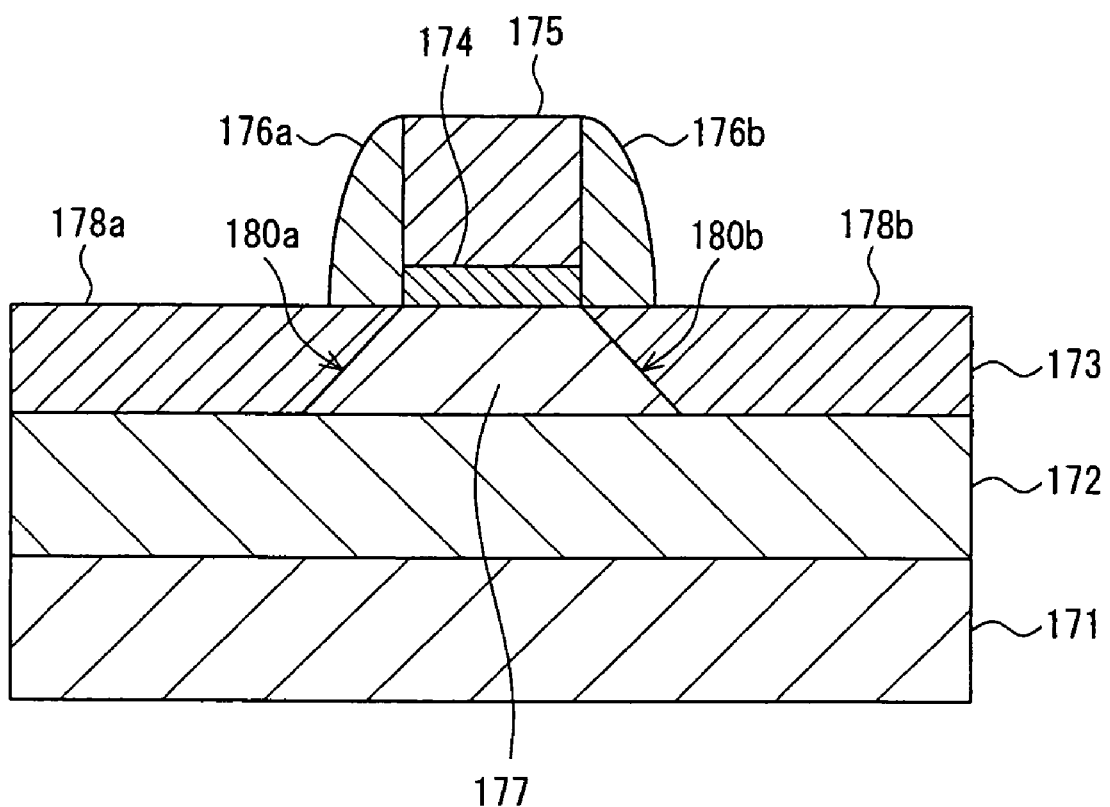
FIG. 4 is a view of a schematic construction of a semiconductor device according to a fourth embodiment of the present invention.

FIG. 4 is a sectional view showing a schematic construction of a semiconductor device according to a fourth embodiment of the present invention.

In FIG. 4, an insulating layer 172 is formed on a supporting substrate 171, and a monocrystal semiconductor layer 173 is formed on the insulating layer 172. A gate electrode 175 is disposed on the monocrystal semiconductor layer 173 via a gate insulating film 174. At one side wall of the gate electrode 175, a side wall 176a is formed, and at the other side wall of the gate electrode 175, a side wall 176b is formed. At one side of the gate electrode 175, a source layer 178a composed of a metal layer with its bottom surface in contact with the insulating layer 172 is disposed. Here, in the metal layer composing the source layer 178a, a joint surface to a channel region 177 is formed along a crystal orientation face 180a of the monocrystal semiconductor layer 173, and schottky junction is performed between the source layer 178a and the monocrystal semiconductor layer 173. A drain layer 178b composed of a metal layer with its bottom surface in contact with the insulating layer 172 is disposed at the other side of the gate electrode 175. Here, in the metal layer composing the drain layer 178b, a joint surface to the channel region 177 is formed along the crystal orientation face 180b of the monocrystal semiconductor layer 173, and schottky junction is performed between the drain layer 178b and the monocrystal semiconductor layer 173. The crystal orientation faces 180a and 180b can be, for example, (111) planes of the monocrystal semiconductor layer 173. As the metal layers composing the source layer 178a and the drain layer 178b, for example, TaN, TiN, W, Pt, Cu and the like can be used.

Thereby, it becomes possible to compose the source layer 178a and the drain layer 178b of the metal layers disposed in all over the depth direction of the monocrystal semiconductor layer 173 while widening the channel region 177 in the depth direction. Therefore, it becomes possible to reduce the resistance of the source layer 178a and the drain layer 178b, and the energy barrier in the deep region of the channel on which control by the gate electrode 175 is difficult to exert can be enhanced, thus making it possible to suppress a short channel effect.

An impurity-doped layer formed in a self-aligned manner to be along the crystal orientation face 180a may be provided at an interface of the alloy layer composing the source layer 178a and the monocrystal semiconductor layer 173. Further, an impurity-doped layer formed in a self-aligned manner to be along the crystal orientation face 180b may be provided at an interface of the alloy layer composing the drain layer 178b and the monocrystal semiconductor layer 173. In the construction in FIG. 4, the explanation is made with the method of using the SOI substrate taken as an example, but the present invention may be applied to the method using a bulk substrate.

Figure 5A:
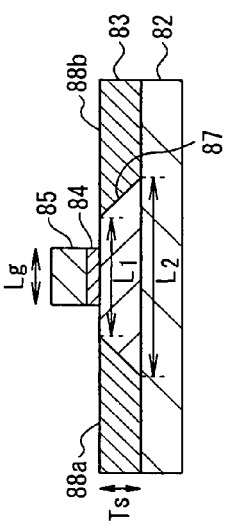
FIGS. 5A to 5D are diagrams showing simulation results of characteristics of the semiconductor device according to one embodiment of the present invention by being compared with the prior art.
Figure 5B:
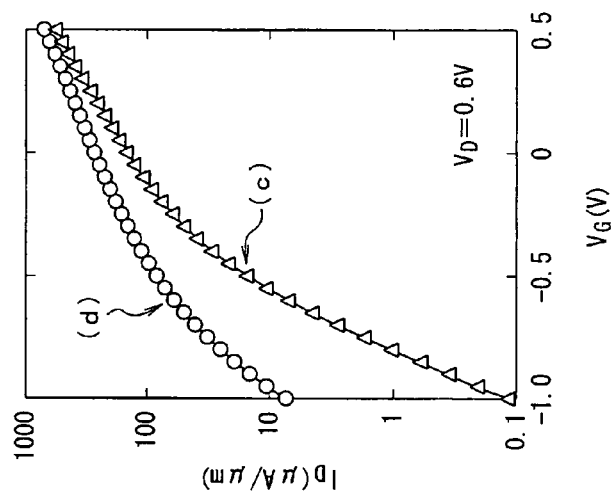
Figure 5C:
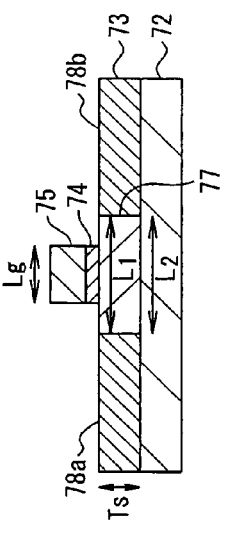
Figure 5D:
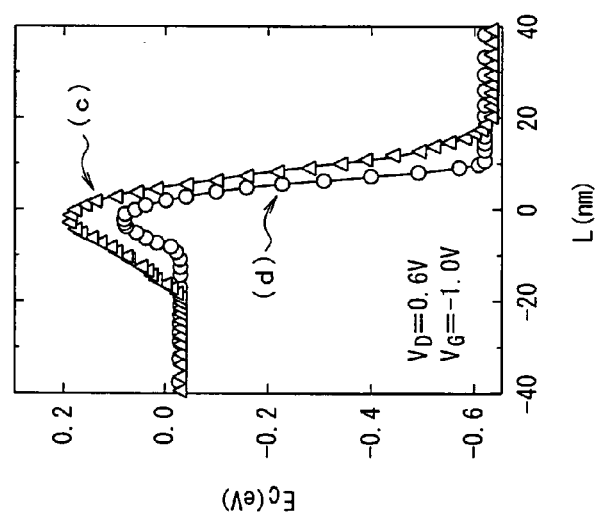

FIGS. 5A and 5B are diagrams showing the simulation result of the characteristics of the semiconductor device according to one embodiment of the present invention by being compared with the prior art, and FIGS. 5C and 5D are sectional views showing the constructions of the semiconductor devices used for the simulation of FIGS. 5A and 5B. FIG. 5A is a diagram showing the simulation result of the potential distribution in the channel direction by being compared with the prior art, FIG. 5B is a diagram showing the simulation result of $V_G$-$I_D$ characteristics by being compared with the prior art, FIG. 5C is a sectional view showing the construction used as the prior art in the simulation of this time, and FIG. 5D is a sectional view showing the construction used as one example of the present invention in the simulation of this time.

In FIG. 5C, a monocrystal Si layer 73 is formed on a BOX layer 72. A gate electrode 75 is disposed on the monocrystal Si layer 73 via a gate insulating film 74. A source layer 78a and a drain layer 78b composed of nickel disilicide are formed in the monocrystal Si layer 73 so that the length of a channel region 77 kept constant in the depth direction.

Meanwhile, in FIG. 5D, a monocrystal Si layer 83 is formed on a BOX layer 82. A gate electrode 85 is disposed on the monocrystal Si layer 83 via a gate insulating film 84. A source layer 88a and a drain layer 88b composed of nickel disilicide are formed in the monocrystal Si layer 83 so that the channel region 77 widens in the depth direction along (111) planes of the monocrystal Si layer 83.

Simulation was performed with film thicknesses Ts of the monocrystal Si layers 73 and 83 set at 10 nm, gate lengths Lg of the gate electrodes 75 and 85 set at 20 nm, work functions $\phi_M$ of the gate electrodes 75 and 85 set at 4.6 eV, film thicknesses of the gate insulating films 74 and 84 set at 1 nm, surface lengths L1 of the channel regions 77 and 87 both set at 20 nm, a bottom surface length L2 of the channel region 77 set at 20 nm, a bottom surface length L2 of the channel region 87 set at 40 nm, the source layers 78a and 88a grounded, and a drain voltage $V_D$=0.6 V applied to the drain layers 78b and 88b.

As a result, as shown in FIG. 5A, it is found out that in the construction of FIG. 5D, control power of the potential at the bottom surface of the channel region 87 by the gate electrode 85 increases and the energy barrier at the bottom surface of the channel region 87 becomes high as compared with the construction of FIG. 5C.

As shown in FIG. 5B, it is found out that in the construction of FIG. 5D, increase in the off current can be suppressed while reduction in the on current is suppressed, as compared with the construction of FIG. 5C.

Figure 6:
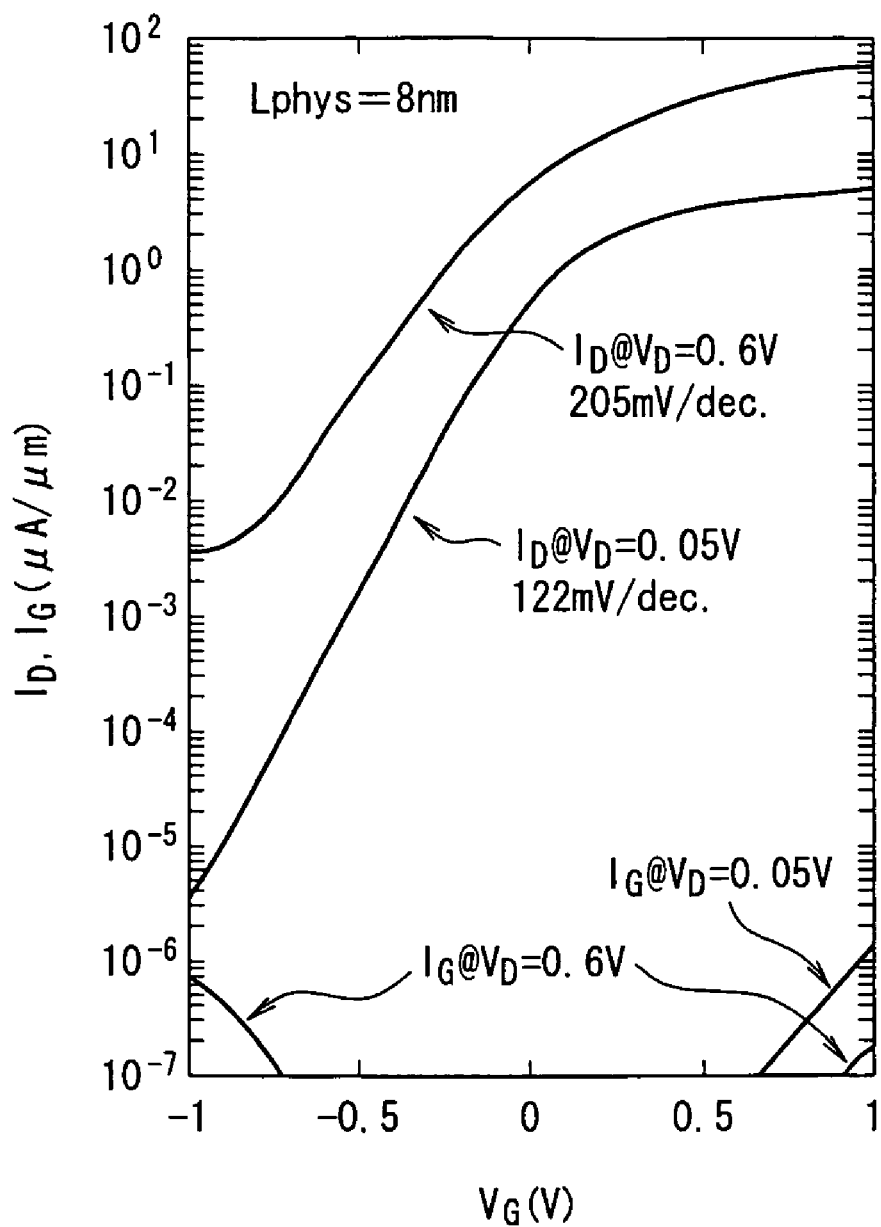
FIG. 6 is a diagram showing $V_G$-$I_D$ and $I_G$ characteristics of the semiconductor device according to one embodiment of the present invention.

FIG. 6 is a diagram showing the $V_G$-$I_D$ characteristics and the $V_G$-$I_G$ characteristics of the semiconductor device according to one embodiment of the present invention. The characteristics in FIG. 6 are measured by experimentally producing the field-effect transistor of the construction of FIG. 1. Here, monocrystal Si is used as the monocrystal semiconductor layer 13, HfAlO$_x$ as the material of the gate insulating film 14, and a nickel disilicide gate as the material of the source layer 18a and the drain layer 18b, with the gate length of the electrode 15 set at 8 nm.

In FIG. 6, as the subthreshold slope value, 122 mV/dec. is obtained, and even when the gate length is set to be short at 8 nm, degradation of the characteristics due to the short channel effect can be suppressed.

FIGS. 7A to 7E are sectional views showing one example of a manufacturing method of a semiconductor device according to a fifth embodiment of the present invention.

Figures 7A, 7B, 7C, 7D, 7E:
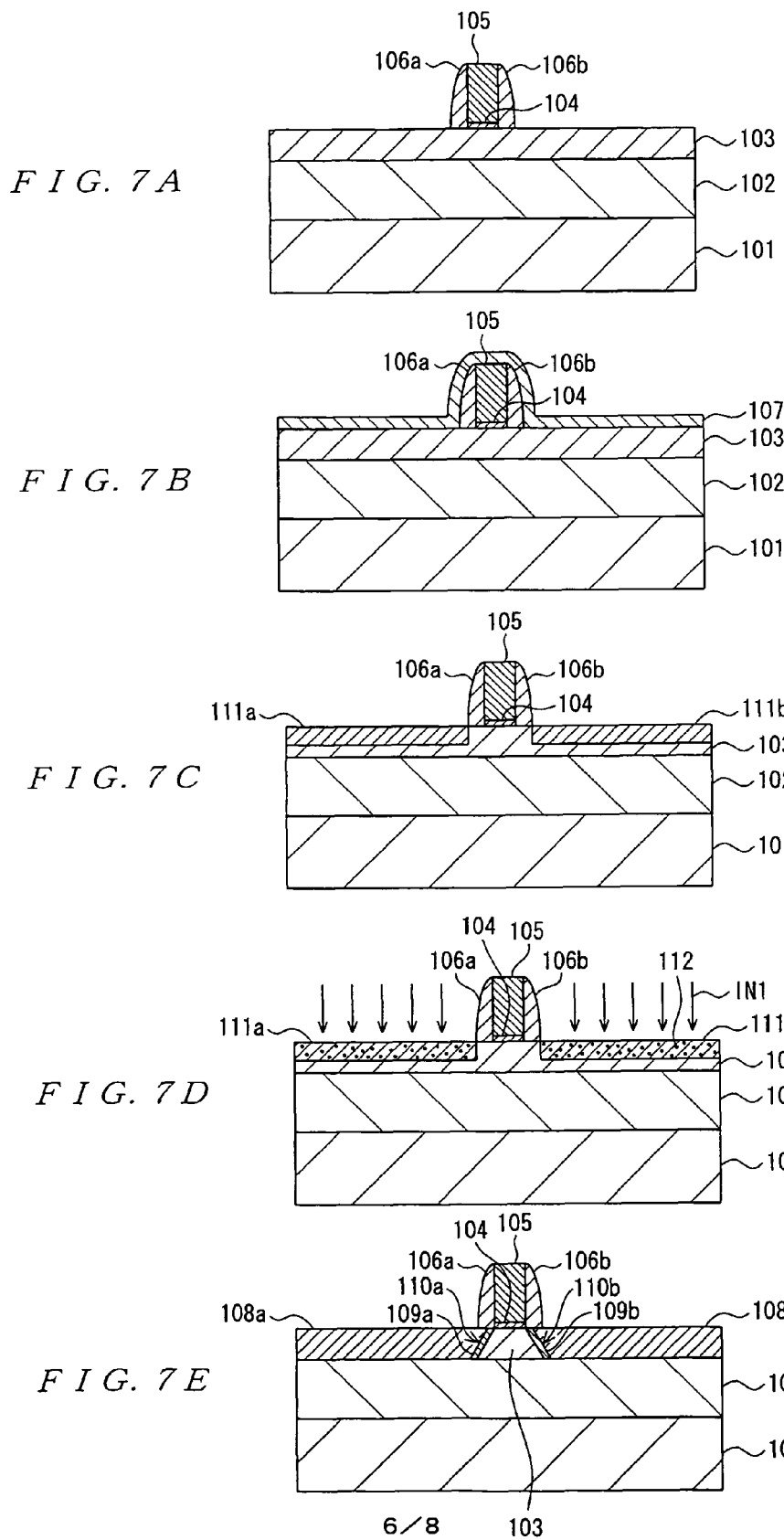
FIGS. 7A to 7E are sectional views showing a manufacturing method of a semiconductor device according to a fifth embodiment of the present invention.

In FIG. 7A, an insulating layer 102 is formed on a supporting substrate 101, and a monocrystal semiconductor layer 103 is formed on the insulating layer 102. Then, by performing thermal oxidation of the surface of the monocrystal semiconductor layer 103, a gate insulating film 104 is formed on the surface of the monocrystal semiconductor layer 103. Then, a conductor film is formed on the monocrystal semiconductor layer 103 on which the gate insulating film 104 is formed by the method such as CVD. Then, by patterning the conductor film using the photolithography technique and etching technique, a gate electrode 105 is formed above the monocrystal semiconductor layer 103. Then, by the method such as CVD, an insulating layer is formed on the entire surface on the monocrystal semiconductor layer 103, and by etching back the insulating layer using anisotropic etching such as RIE, side walls 106a and 106b are respectively formed at side walls of the gate electrode 105.

Next, as shown in FIG. 7B, by a method such as sputtering, a metal film 107 is formed on the monocrystal semiconductor layer 103 on which the side walls 106a and 106b are formed. In this case, the metal film 107 is capable of being alloyed by reacting with the monocrystal semiconductor layer 103, and for example, a Ti film, a Co film, a W film, a Mo film, an Ni film, a Pt film or the like can be used.

Next, as shown in FIG. 7C, thermal treatment of the monocrystal semiconductor layer 103 on which the metal film 107 is formed is performed, and the monocrystal semiconductor layer 103 is reacted with the metal film 107, whereby, alloy layers 111a and 111b disposed at the sides of the side walls 106a and 106b are formed on the monocrystal semiconductor layer 103. Then, after the alloy layers 111a and 111b are formed, wet etching of the metal film 107 is performed, and thereby unreacted metal film 107 is removed.

Next, as shown in FIG. 7D, ion implantation IN1 of an impurity 112 such as As, P and B is performed with the gate electrode 105 and the side walls 106a and 106b as a mask, and thereby, the impurity 112 is introduced into the alloy layers 111a and 111b.

Next, as shown in FIG. 7E, thermal treatment of the monocrystal semiconductor layer 103 is performed with the impurity 112 implanted into the alloy layers 111a and 111b, and thereby, while joint surfaces to the alloy layers 111a and 111b are formed respectively along crystal orientation surfaces 110a and 110b of the monocrystal semiconductor layer 103, a source layer 108a and a drain layer 108b which are respectively composed of the alloy layers 111a and 111b with their bottom surfaces in contact with the insulating layer 102 are formed. When thermal treatment of the monocrystal semiconductor layer 103 is performed with the impurity 112 implanted into the alloy layers 111a and 111b, the impurity 112 implanted into the alloy layers 111a and 111b diffuses to the monocrystal semiconductor layer 103 side, and impurity-doped layers 109a and 109b respectively disposed at interfaces of the source layer 108a and the drain layer 108b, and the monocrystal semiconductor layer 103 are formed in a self-aligned manner.

Thereby, it becomes possible to compose the source layer 108a and the drain layer 108b of the alloy layers disposed in all over the depth direction of the monocrystal semiconductor layer 103 while widening the channel region 103 in the depth direction, and the impurity-doped layers 109a and 109b can be formed by diffusing the impurity 112 expelled from the alloy layers 111a and 111b to the monocrystal semiconductor layer 103 side, thus making it possible to dispose the impurity-doped layers 109a and 109b in a self-aligned manner along the interfaces of the source layer 108a and the drain layer 108b and the monocrystal semiconductor layer 103. Therefore, even when the alloy layers are formed in the source layer 108a and the drain layer 108b so that the bottom surfaces are in contact with the insulating layer 102, it becomes possible to keep the alloy layers from being in contact with the monocrystal semiconductor layer 103 being the channel region, and it becomes possible to reduce resistance of the source layer 108a and the drain layer 108b while suppressing junction leak, thus making it possible to enhance the energy barrier in the deep region of the channel on which control by the gate electrode 105 is difficult to exert, and making it possible to suppress the short channel effect.

By diffusing the impurity 112 to the monocrystal semiconductor layer 103 side via the alloy layers 111a and 111b, the temperature necessary to introduce the impurity 112 to the monocrystal semiconductor layer 103 side can be lowered, thus making it possible to reduce a damage to the metal gate and the high dielectric constant insulating film, and eliminating necessity of directly performing the ion implantation IN1 to the monocrystal semiconductor layer 103 to introduce the impurity 112 into the monocrystal semiconductor layer 103, and a crystal defect occurring to the channel region 103 can be reduced.

Figure 8A:
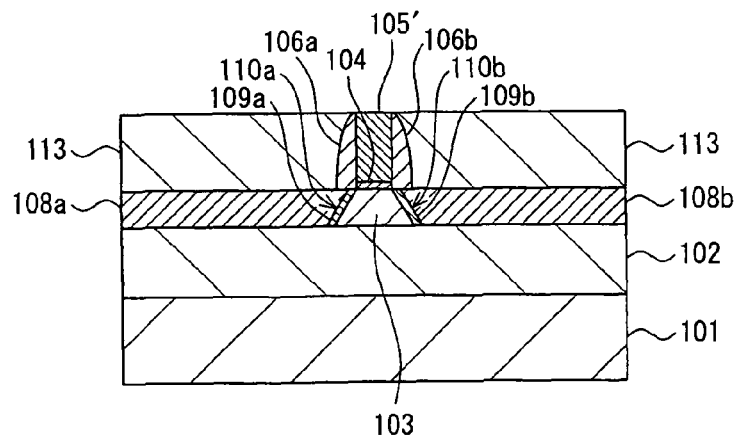
FIGS. 8A to 8C are sectional views showing a manufacturing method of a semiconductor device according to a sixth embodiment of the present invention.
Figure 8B:
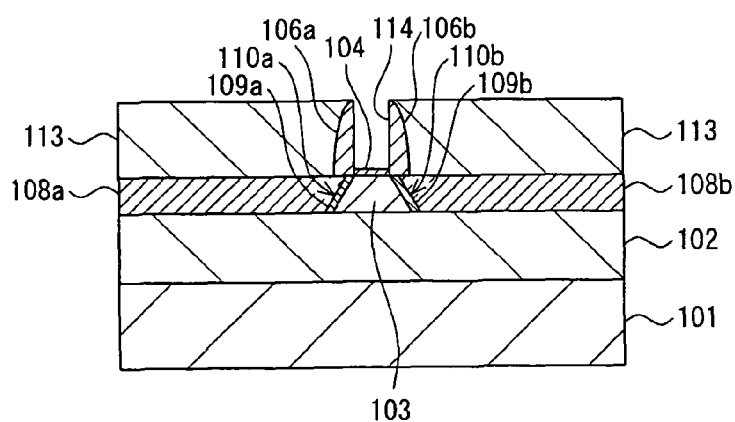
Figure 8C:
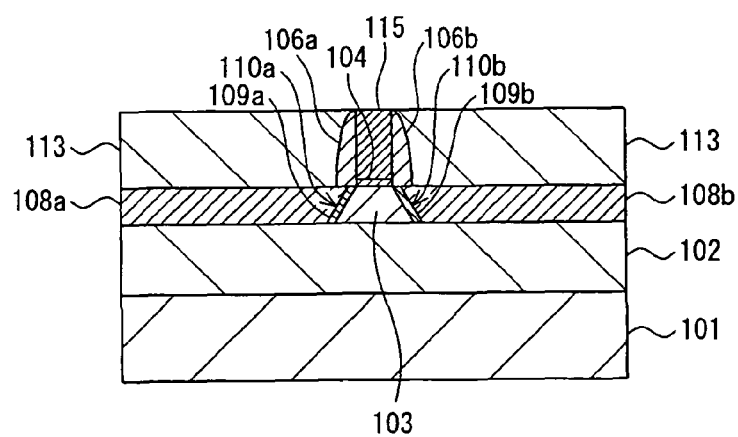

FIGS. 8A to 8C are sectional views showing a manufacturing method of a semiconductor device according to a sixth embodiment of the present invention.

In FIG. 8A, after the process step of FIG. 7E, an insulating film 113 is deposited on the entire surface on the monocrystal semiconductor layer 103 by a method such as CVD. In the sixth embodiment, a dummy gate electrode 105' is formed instead of the gate electrode 105, and thereafter, the process steps in FIGS. 7A to 7E are performed. In this case, as the material of the dummy gate electrode 105', an insulator such as, for example, a silicon oxide film and a silicon nitride film can be used. By thinning the insulating film 113 by a method such as CMP (chemical mechanical polishing) or etch back, the surface of the dummy gate electrode 105' is exposed.

Next, as shown in FIG. 8B, the dummy gate electrode 105' is removed with the insulating film 113 left on the monocrystal semiconductor layer 103 by a method such as wet etching, and a trench 114 with the side walls 106a and 106b disposed at the side walls is formed in the insulating film 113.

Next, as shown in FIG. 8C, a conductor film disposed to fill the trench 114 is formed on the insulating film 113 by a method such as CVD. Then, the conductor film is thinned by a method such as CMP, and thereby, the gate electrode 115 buried in the trench 114 is formed on the monocrystal semiconductor layer 103.

Thereby, it becomes possible to form the gate electrode 115 after forming the impurity-doped layers 109a and 109b while keeping self alignment property of the disposing position of the gate electrode 115 with respect to the impurity-doped layers 109a and 109b. Therefore, thermal load necessary for formation of the impurity-doped layers 109a and 109b and the like can be prevented from exerting on the gate electrode 115, and it becomes possible to facilitate metallization of the gate electrode 115.

FIGS. 9A to 9F are sectional views showing a manufacturing method of a semiconductor device according to a seventh embodiment of the present invention.

Figures 9A, 9B, 9C, 9D, 9E, 9F:
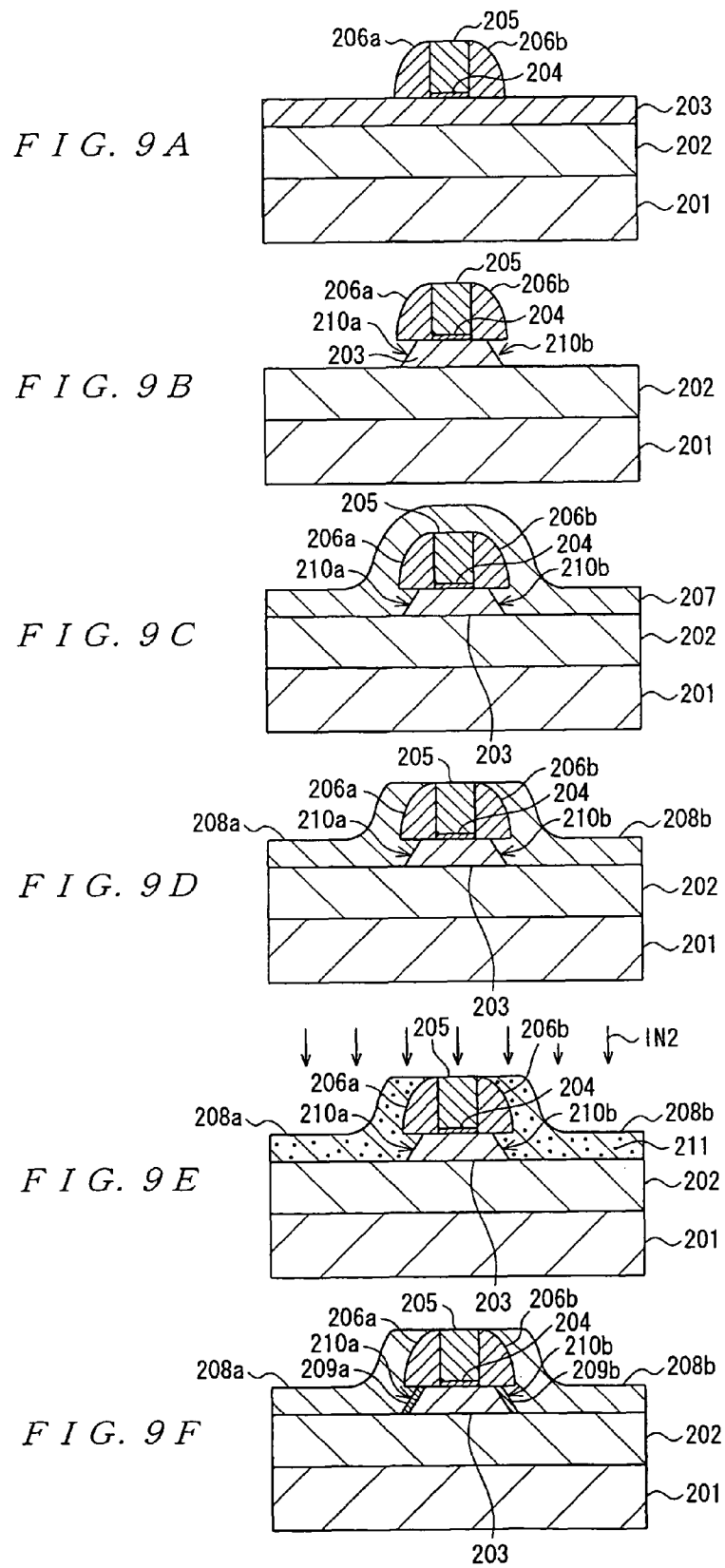
FIGS. 9A to 9F are sectional views showing a manufacturing method of a semiconductor device according to a seventh embodiment of the present invention.

In FIG. 9A, an insulating layer 202 is formed on a supporting substrate 201, and a monocrystal semiconductor layer 203 is formed on the insulating layer 202. Then, by performing thermal oxidation of the surface of the monocrystal semiconductor layer 203, a gate insulating film 204 is formed on the surface of the monocrystal semiconductor layer 203. Then, a conductor film is formed by a method such as CVD on the monocrystal semiconductor layer 203 on which the gate insulating film 204 is formed. Then, by patterning the conductor film using the photolithography technique and the etching technique, a gate electrode 205 is formed above the monocrystal semiconductor layer 203, and thereafter, side walls 206 and 206b are respectively formed at side walls of the gate electrode 205.

Next, as shown in FIG. 9B, by performing wet etching for the monocrystal semiconductor layer 203 with the gate electrode 205, and the side walls 206a and 206b as a mask, the monocrystal semiconductor layer 203 at both sides of the gate electrode 205 is removed while inclined surfaces of the monocrystal semiconductor layer 203 are exposed along the crystal orientation faces 210a and 210b. The crystal orientation faces 210a and 210b can be, for example, (111) planes. As an etching solution for the monocrystal semiconductor layer 203, for example, KOH and TMAH (Tetra Methyl Ammonium Hydro-oxide) solutions can be used.

Next, as shown in FIG. 9C, by a method such as sputtering, a metal film 207 is formed on the insulating layer 202 to cover the crystal orientation faces 210a and 210b. In this case, as the metal film 207, for example, TaN, TiN, W, Pt, Cu and the like can be used. Instead of the metal film 207, an alloy film such as silicide may be formed on the insulating film 202.

As shown in FIG. 9D, by flattening the metal film 207 by a method such as CMP, the metal film 207 on the gate electrode 205 is removed, and a source layer 208a and a drain layer 208b composed of the metal film 207 with schottky junction to the monocrystal semiconductor layer 203 performed via the crystal orientation faces 210a and 210b are formed.

Next, as shown in FIG. 9E, by performing ion-implantation IN2 of an impurity 211 such as As, P and B with the gate electrode 205 and the side walls 206a and 206b as a mask, the impurity 211 is introduced into the metal film 207 in the source layer 208a and the drain layer 208b.

Next, as shown in FIG. 9F, by performing thermal treatment of the monocrystal semiconductor layer 203 with the impurity 211 implanted into the metal film 207, the impurity 211 implanted into the metal film 207 is diffused to the monocrystal semiconductor layer 203 side, and impurity-doped layers 209a and 209b respectively disposed at the interfaces of the source layer 208a and the drain layer 208b and the monocrystal semiconductor layer 203 are formed in a self-aligned manner.

Thereby, it becomes possible to compose the source layer 208a and the drain layer 208b of the metal film or the alloy film disposed in all over the depth direction of the monocrystal semiconductor layer 203, while widening the channel region 203 in the depth direction, and since the source layer 208a and the drain layer 208b are composed of the metal film or the alloy film, it becomes unnecessary to react metal with the monocrystal semiconductor layer 203. Therefore, even when the source layer 208a and the drain layer 208b are composed of the metal film or the alloy film, it becomes possible to extend range of choices of the kind of the metal film or the alloy film, and it becomes possible to stabilize the composition of the metal film or the alloy film. Further, it becomes possible to reduce resistance of the source layer 208a and the drain layer 208b, and a short channel effect can be suppressed.

In the embodiment in FIGS. 9A to 9F, the method for forming the impurity-doped layers 209a and 209b at the interfaces of the source layer 208a and the drain layer 208b and the monocrystal semiconductor layer 203 is described, but the impurity-doped layers 209a and 209b may be omitted. Further, in the construction of FIGS. 9A to 9F, the explanation made with the method for using the SOI substrate is described, but the present invention may be applied to the method using a bulk substrate.

What is claimed is:

1. A semiconductor device, comprising:
   an insulating layer;
   a semiconductor layer formed on the insulating layer, the semiconductor layer including a channel region and defining a first crystal face and a second crystal face;
   a gate insulating film disposed on the semiconductor layer;
   a gate electrode disposed on the gate insulating film;
   a source layer including a first alloy layer or a first metal layer, and having a bottom surface, the bottom surface of the source layer being in contact with the insulating layer, the source layer defining a joint surface of the source layer adjacent to the channel region disposed along the first crystal face of the semiconductor layer;
   a drain layer including a second alloy layer or a second metal layer, and having a bottom surface, the bottom surface of the drain layer being in contact with the insulating layer, the drain layer defining a joint surface of the drain layer adjacent to the channel region disposed along the second crystal face of the semiconductor layer;
   a first impurity doped layer along an interface of the first alloy layer or the first metal layer of the source layer, and the semiconductor layer; and
   a second impurity doped layer along an interface of the second alloy layer or the second metal layer of the drain layer, and the semiconductor layer,
   the first crystal face and the second crystal face being (111) plane.

2. A semiconductor device, comprising:
   a semiconductor substrate having a channel region and defining a first crystal face and a second crystal face;

a gate insulating film disposed on the semiconductor substrate;

a gate electrode disposed on the gate insulating film;

a source layer including a first alloy layer or a first metal layer, the source layer defining a joint surface of the source layer adjacent to the channel region disposed along the first crystal face of the semiconductor substrate;

a drain layer including a second alloy layer or a second metal layer, the drain layer defining a joint surface of the drain layer adjacent to the channel region disposed along the second crystal face of the semiconductor substrate;

a first impurity doped layer disposed along an interface of the first alloy layer or the first metal layer of the source layer, and the semiconductor substrate; and a second impurity doped layer disposed along an interface of the second alloy layer or the second metal layer of the drain layer, and the semiconductor substrate, the first crystal face and the second crystal face being (111) plane.

* * * * *